United States Patent [19]
Emura et al.

[11] Patent Number: 5,325,382
[45] Date of Patent: Jun. 28, 1994

[54] METHOD AND ELECTRODE ARRANGEMENT FOR INDUCING FLAT FREQUENCY MODULATION RESPONSE IN SEMICONDUCTOR LASER

[75] Inventors: Katsumi Emura; Ikuo Mito; Yoshihiko Suemura, all of Tokyo, Japan

[73] Assignee: NEC Corporation, Tokyo, Japan

[21] Appl. No.: 767,718

[22] Filed: Sep. 30, 1991

[30] Foreign Application Priority Data

Sep. 28, 1990 [JP] Japan .................. 2-261151
Oct. 12, 1990 [JP] Japan .................. 2-273849

[51] Int. Cl.$^5$ ............................................. H01S 3/10
[52] U.S. Cl. ............................. 372/26; 372/32; 372/38; 372/50; 372/96
[58] Field of Search ............... 372/26, 27, 32, 50, 372/38, 96

[56] References Cited

U.S. PATENT DOCUMENTS

| | | | |
|---|---|---|---|
| 4,669,086 | 5/1987 | Kaede et al. | 372/32 |
| 4,920,542 | 4/1990 | Brosson et al. | 372/26 |
| 5,088,097 | 2/1992 | Ono et al. | 372/50 |
| 5,119,393 | 6/1992 | Oka et al. | 372/50 |

FOREIGN PATENT DOCUMENTS 0128297 12/1984 European Pat. Off. .
59-188988 10/1984 Japan .
223791 9/1989 Japan .

OTHER PUBLICATIONS

Y. Yamamoto et al, "Modulation and Demodulation Technology for Coherent Optical Fiber Transmission—FSK Heterodyne Detection", vol. 31, Dec. 1982, No. 12, pp. 2173-2184.
H. Miyata et al, "Bias Dependence of . . . Three–electrode Long Cavity DFB-LD", No. C-143 of 1990 Spring General Assembly of Japanese Electronic Information Communication, p. 4-198, (no month).
S. Murata et al, "Spectral Characteristics for . . . with Frequency-Tuning Region", IEEE Journal of Quantum Electronics, vol. QE-23, No. 6, Jun. 1987, pp. 835-838.
T. P. Lee et al., "Linewidth and Fm Characteristics of a Distributed Feedback Laser Monolithically Integrated With a Tunable External Cavity", vol. 23, No. 4, Feb. 12, 1987, Stevenage, Herts, GB.
T. L. Koch et al., "Continuously Tunable 1.5 num Multiple Quantum Well GaInAs/GaInAsP Distributed Bragg Reflector Lasers", vol. 24, No. 23, Nov. 10, 1988, Stevenage, Herts, GB, pp. 1431-1433.
Xing Pan et al., "Modulation Characteristics of Tunable DFB/DBR Lasers with One or Two Passive Tuning Sections", IEEE Journal of Quantum Electronics, vol. 25, No. 6, Jun. 1989.

*Primary Examiner*—James W. Davie
*Attorney, Agent, or Firm*—Sughrue, Mion, Zinn, Macpeak & Seas

[57] ABSTRACT

In order to induce a flat frequency modulation response in a multi-electrode semiconductor laser which includes an active region and at least one phase control region with no active layer, a modulation current is applied to both of the active region and the phase control region. Further, an improved electrode arrangement for inducing a flat frequency modulation response in a multi-electrode semiconductor laser is present. The semiconductor laser includes three regions: an active region, a phase control region and a Bragg reflector region. Each of the active region, the phase control region and the Bragg reflector region being provided with an electrode for receiving an injection current, wherein the electrode provided for the active layer extends into the phase control region.

8 Claims, 8 Drawing Sheets

METHOD AND ELECTRODE ARRANGEMENT FOR INDUCING FLAT FREQUENCY MODULATION RESPONSE IN SEMICONDUCTOR LASER

BACKGROUND OF THE INVENTION

1. Field of the Invention

The present invention relates generally to a method of inducing flat frequency modulation response characteristics in a semiconductor laser, and also to an electrode arrangement for a semiconductor laser for attaining such a flat modulation frequency response.

2. Description of the Prior Art

In optical fiber communication systems, a transmission rate up to 2.5 Gb/s (Giga bits per second) is currently possible and the trend toward even higher rates is accelerating.

In particular, optical heterodyne transmission technologies, which are now under development, utilize a semiconductor laser as a single-mode light source. Such an optical heterodyne transmission allows signal receiver sensitivity to increase in the order of one digit as compared with direct detection techniques and, further is able to render optical frequency division multiplexing a practicality. This latter mentioned technique is seen as the key to the next generation of optical or coherent communications systems.

In such an optical heterodyne communications system, three techniques are utilized for light modulation: FSK (Frequency Shift Keying), PSK (Phase Shift Keying) and ASK (Amplitude Shift Keying). As is known, modulation of a current, injected into a semiconductor laser, changes a refractive index of the laser, which results in the light output frequency being modulated by the current injected into the semiconductor laser.

According to FSK, an optical signal to be detected by heterodyne detection techniques, can be produced merely by modulating an injection current to a semiconductor laser. FSK features that (a) a transmitter can be configured in the same manner as in ASK and (b) receiver sensitivity is improved as compared with ASK. Accordingly, the research and development of FSK modulation of a semiconductor laser are extensive.

In order to practically realize such a direct frequency modulation (FM) using a semiconductor laser, it is necessary to fabricate a laser whose optical output signal has a narrow spectral linewidth and whose modulation frequency response is flat over a wide range.

The instant invention is directly concerned with an improvement for achieving a wide range of flat frequency response in a direct frequency modulation of a semiconductor laser.

As is known, if the frequency of a modulation current is less than several hundreds of KHz, the oscillation frequency of a semiconductor laser depends on a thermal effect wherein a refractive index of the laser increases with increase in the modulation current. This frequency deviation is referred to as a red-shift, viz., a shift to a lower frequency with increase in the modulation current. On the other hand, in the case where the frequency of the modulation current is more than several MHz, a carrier effect becomes dominant and the oscillation frequency of the semiconductor laser shifts to a higher frequency with increase in the modulation current. This is referred to as a blue-shift.

However, in order to achieve optical heterodyne communication, even if the frequency of a modulation current varies from a few KHz to several hundreds MHz, a frequency modulation response should be flat over a wide modulation frequency range.

The above-mentioned problems inherent in a semiconductor laser, have been discussed in detail in a Japanese paper entitled "Modulation and Demodulation Technology for Coherent Optical Fiber Transmission—FSK Heterodyne Detection" by Yoshihisa YAMAMOTO and Tatsuya KIMURA, a practicing report of researches, volume 31, No. 12, pages 2173–2184 issued by Nippon Telegraph & Telephone (NTT) Corporation (prior art paper No. 1).

According to a known approach to solving the aforesaid problems, an electrode of a Distributed Feedback (DFB) type semiconductor laser is divided into a plurality of sections. The bias conditions of the currents applied to the plural electrodes are appropriately controlled. This approach has been proposed in a Japanese paper entitled "Bias Dependence of FM Response in Three-electrode Long Cavity DFB-LD" by H. Miyata, et al, No. C-143 of 1990 Spring General Assembly of Japanese Electronic Information Communication (prior art paper No. 2). However, this prior art has encountered the difficulty that the bias conditions are strictly limited for exhibiting a satisfied frequency response.

Other known efforts to overcome these problems are disclosed in a paper entitled "Spectral Characteristics for a 1.5 $\mu$m DBR Laser with Frequency-Tuning Region" by S. Murata, et al., IEEE Journal of Quantum Electronics, Vol. QE-23, No. 6, June 1987, pages 835–838 (prior art paper No. 3). According to paper No. 3, the laser structure of a Distributed Bragg Reflector (DBR) type laser is divided into three regions (viz., action region, phase control region, DBR region) which are independently provided with electrodes. The FM is implemented within the phase control and DBR regions each of which has no light emitting layer. However, according to this prior art, the frequency response is undesirably restricted to a few hundred MHz due to carrier lifetime.

Still further, Japanese Patent Application No. 63-50205, which was primarily published Sep. 6, 1989 under publication No. 1-223791, discloses a four-electrode DFB type semiconductor laser (prior art paper No. 4). According to this publication, a phase control region is provided with two electrodes one of which is reverse biased, and a frequency modulation is implemented in the reverse biased region. However, this prior art disclosed in Japanese Patent Application No. 63-50205 has encountered the difficulty that a suitable efficiency of frequency modulation is not expected in that the refractive index variation in the reversed bias region is insufficient.

Before turning to the instant invention, it is deemed preferable to discuss a known semiconductor structure to which a method of the instant invention is applicable.

FIG. 1A is a perspective view of a known multi-electrode DBR type semiconductor laser chip 10, while FIG. 1B is a cross sectional schematic of the laser chip 10 of FIG. 1A viewed at section I-I'.

As best shown in FIG. 1B, the laser chip 10 includes three regions: an active region 12 (300 $\mu$m long), a phase control region 14 (150 $\mu$m long), and a DBR region (500 $\mu$m long). An Sn-doped n-InP substrate 18 carries a grating 20 (240 nm pitch, $7 \times 10^{17}/cm^3$ carrier density) on the top surface thereof at the DBR region 16. A non-doped InGaAsP active layer 22 (0.1 $\mu$m thickness, 1.55 μm wavelength) is formed on the substrate 18 in the active region 12, while an InGaAsP wave guide layer 24 (0.2 μm thickness, 1.3 μm wavelength) is present on the regions 14, 16. A p-InP cladding layer 26 (2 μm thickness, Zn-doped, $1\times 10_{18}/cm_3$ carrier density) is formed on the active layer 22 and the wave guide layer 24.

Although not illustrated in FIG. 1B, a Zn-doped p-InGaAsP contact layer (0.5 μm thickness, $1\times 10^{18}/cm^3$ carrier density) is grown over the entire region of the cladding layer 26, after which an electrode layer of Cr/Au is formed on the entire surface of the contact layer. The contact and electrode layers undergo preferential etching to be divided into three electrically isolated electrodes. As shown in FIG. 1B, the divided contact layers of the regions 12, 14 and 16 are respectively denoted by 28a, 28b and 28c, while the divided electrodes of the regions 12, 14 and 16 are represented by 30a, 30b and 30c, respectively.

Further, another electrode 32 is formed on the side of the substrate 18, which is opposite to the active layer 22 and the wave guide layer 24.

For the purpose of transverse mode control, a mesa stripe 34 is formed, after which Fe-doped, InP layers 36 and 38 are formed on either side thereof (see FIG. 1A).

The laser chip 10 is mounted on a diamond heat sink (not shown) with the p-type side up configuration. An oscillation threshold current, a differential quantum efficiency, a maximum light output are, 20 mA, 0.15 W/A and 30 mW, respectively. The active region 12 is injected so as to obtain a light output of 10 mW, wherein an oscillation wavelength is 1.550 μm.

Reference is made to FIG. 2, wherein a method of directly modulating frequency of a light output is schematically illustrated. A laser chip structure shown in FIG. 2 is identical with that of FIGS. 1A and 1B. Accordingly, like numerals are used and redundant descriptions will be omitted for brevity.

As mentioned above, if the frequency of a modulation current is less than several hundreds KHz, the oscillation frequency of a semiconductor laser encounters a thermal effect wherein a refractive index of the laser increases with increase in the modulation current (viz., red-shift). On the other hand, in the event that the frequency of the modulation current exceeds several MHz, the oscillation frequency of the semiconductor laser shifts to a higher frequency with increase in the modulation current due to carrier effect (viz., blue-shift).

Thus, if a modulation current is injected into the active region 12 as shown in FIG. 2, the frequency modulation response may be plotted as indicated by a chained line 50 in FIG. 4. It is clearly understood that a flat frequency modulation response cannot be expected over a wide range.

On the other hand, if a modulation current is injected into the phase control region 14 as shown in FIG. 3, the frequency modulation response of the nature depicted by the broken line trace 52 in FIG. 4. In this instance, the frequency deviation is approximately 2 GHz/mA which is a few times greater than the case depicted in FIG. 3 (viz., the case wherein the modulation current is injection into the active region 12). However, the frequency modulation response is limited by carrier lifetime and thus the upper limit thereof is only about 600 MHz.

SUMMARY OF THE INVENTION

It is an object of the present invention to provide a method of inducing a flat modulation frequency response in a semiconductor laser from a low frequency up to about 10 GHz.

Another object of the present invention is to provide an electrode arrangement of a semiconductor laser for inducing a flat modulation frequency response in a semiconductor laser from low frequency up to about 10 GHz.

In brief, the above objects are achieved by a method wherein, in order to induce a flat frequency modulation response in a multi-electrode semiconductor laser which includes an active region and at least one phase control region with no active layer, a modulation current is applied to both of the active region and the phase control region Further, an improved electrode arrangement for inducing a flat frequency modulation response in a multi-electrode semiconductor laser is present. The semiconductor laser includes three regions: an active region, a phase control region and a Bragg reflector region. Each of the active region, the phase control region and the Bragg reflector region being provided with an electrode for receiving an injection current, wherein the electrode provided for the active layer extends into the phase control region.

More specifically a first aspect of the present invention is a method of inducing a flat frequency modulation response in a multi-electrode semiconductor laser which includes an active region and at least one phase control region with no active layer, including the step of applying a modulation current to the active region and the phase control region.

Second aspect of the present invention is arrangement of a multi-electrode semiconductor laser which includes: a substrate; an active region formed on the substrate and having a first lightwave guide which functions as a gain medium of laser oscillation; a phase control region formed on the substrate and having a second lightwave guide for controlling phases of oscillation wavelength; a Bragg reflector region formed on the substrate and having a third lightwave guide with a grating, the first, second and third lighwave guides being connected in series; and each of the active region, the phase control region and the Bragg reflector region being provided with an electrode for receiving an injection current; characterized in that the electrode provided for the active layer extends into the phase control region.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first direct frequency modulation technique for a semiconductor laser according to the present invention will be discussed with reference to FIGS. 5 and 6.

Figure 1A:
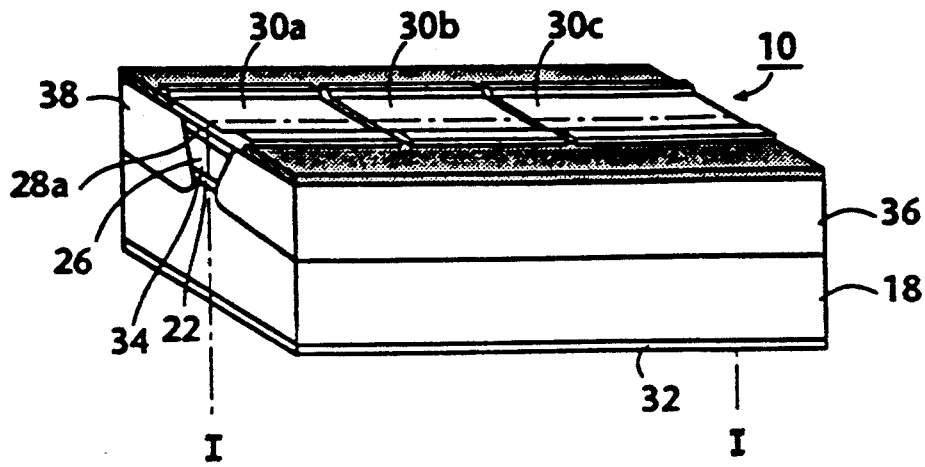
FIG. 1A is a perspective view of a known semiconductor laser, which has been discussed in the opening paragraphs of the instant specification.
Figure 1B:
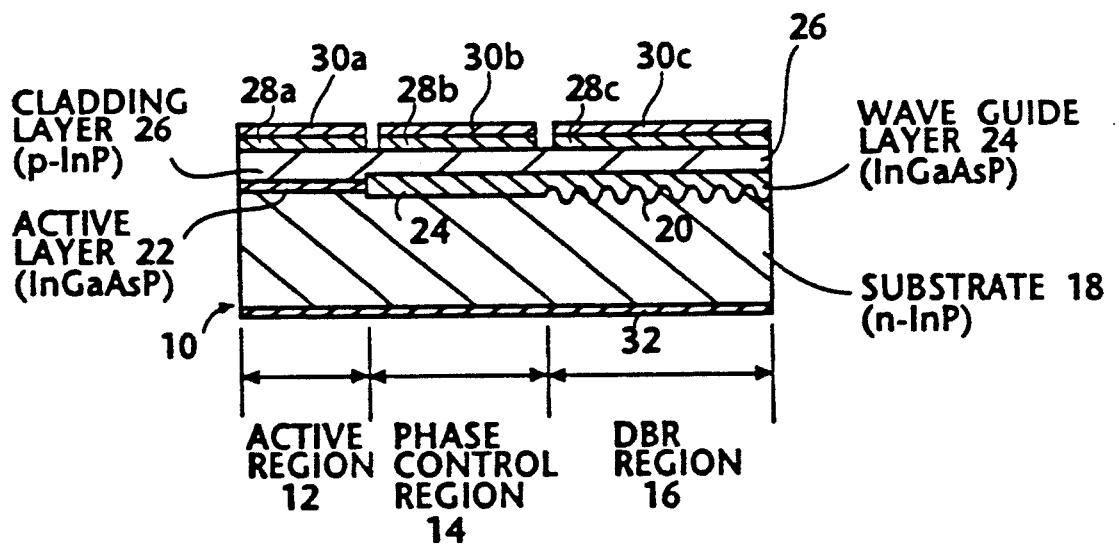
FIG. 1B is a cross sectional view taken from A and A'.
Figure 2:
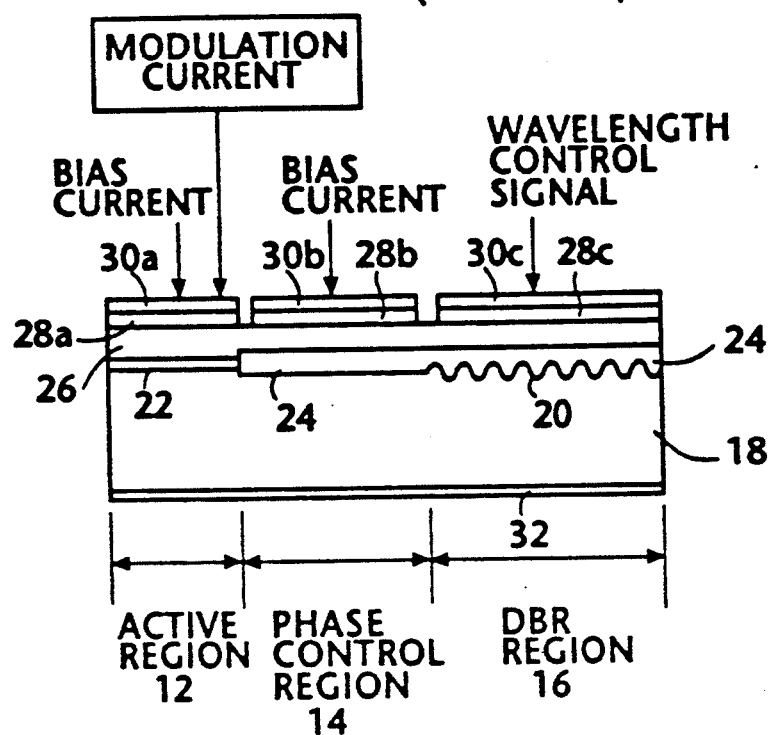
FIGS. 2 and 3 each is a cross section of a known semiconductor laser demonstrating a known method of direct frequency modulation, which has been discussed in the opening paragraphs of the instant specification.
Figure 3:
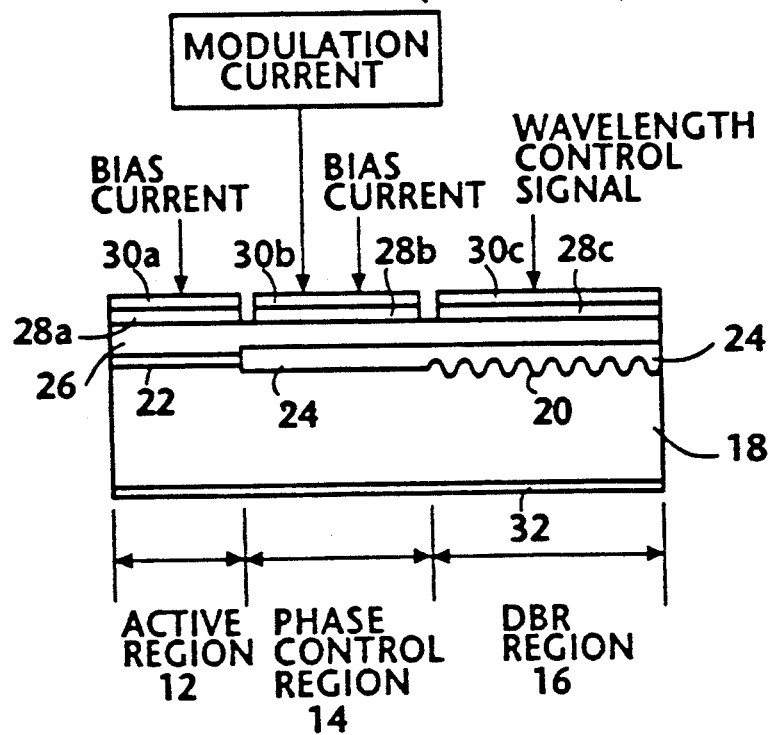
Figure 5:
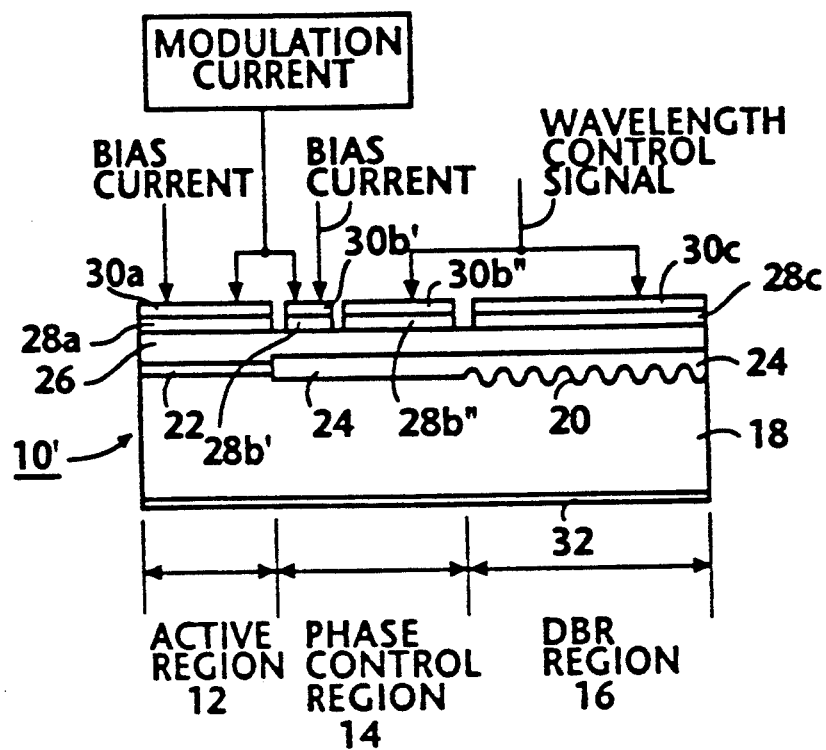
FIG. 5 illustrates a first embodiment of direct frequency modulation according to the present invention.
Figure 6:
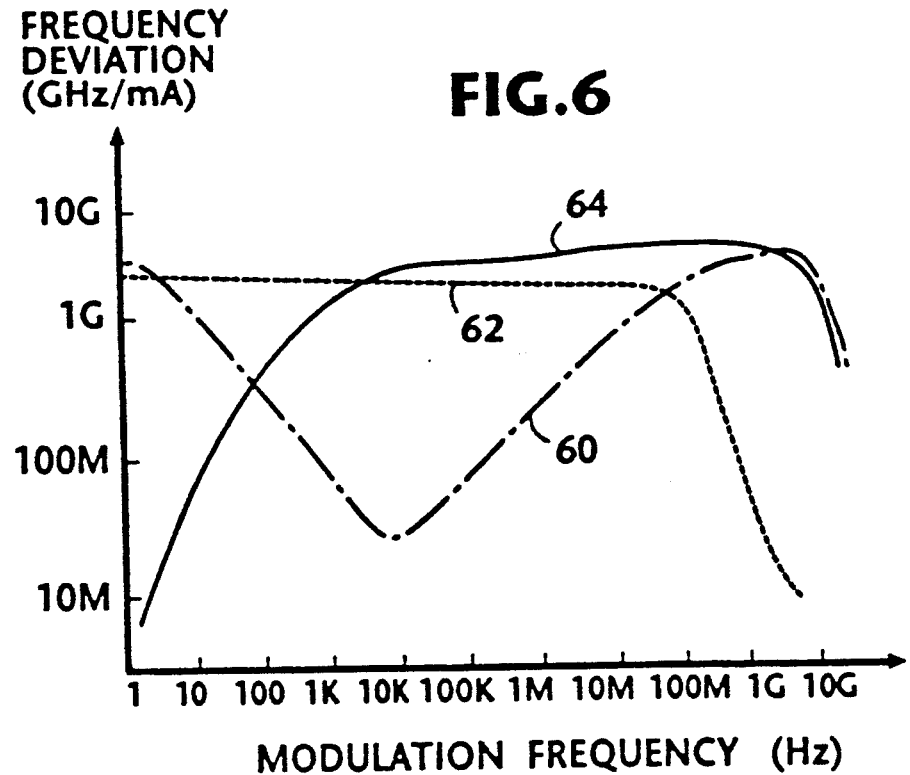
FIG. 6 is a graph showing a frequency modulation response according to the technique shown in FIG. 5 together with known frequency modulation responses.

A four-electrode semiconductor laser chip 10' shown in FIG. 5 differs from that shown in FIGS. 1A and 1B in that the electrode 30b of the latter structure is divided two electrodes 30b', 30b". With this division of the electrode 30b, the contact layer 28b in FIGS. 1A and 1B is divided into two layers 28b' and 28b" accordingly. The remaining portions of the laser chip shown in FIG. 5 are identical with those in FIGS. 1A and 1B, and hence further descriptions thereof will be omitted for the sake of brevity.

As shown in FIG. 5, bias currents are applied to the electrodes 30a and 30b', while a wavelength control signal is applied to the electrodes 30b' and 30c. On the other hand, a modulation current is applied to both of the electrodes 30a and 30b'. The first embodiment features the application of the modulation current to the electrodes 30a, 30b'. In order to adjust the frequency modulation response derived from such an application of the modulation currents to the two electrodes 30a and 30b', the bias current is applied to the electrode 30b'. In more specific terms, the bias current fed to the electrode 30b' is to adjust the frequency modulation efficiencies at the active and phase control regions 12, 14.

Figure 4:
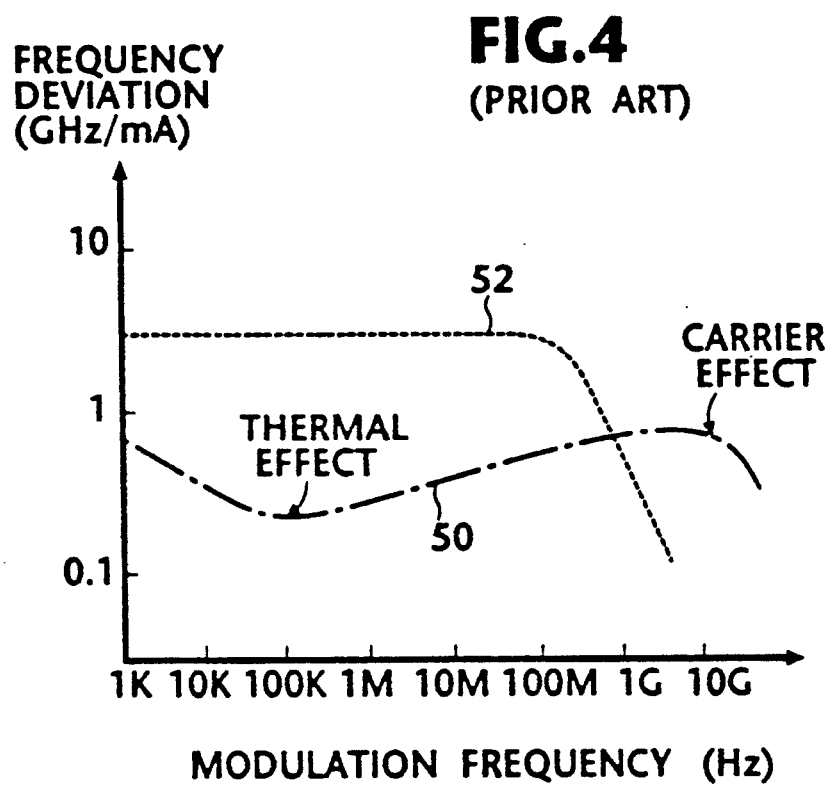
FIG. 4 is a graph showing the frequency modulation response characteristics obtained from the direct frequency modulation techniques illustrated in FIGS. 2 and 4.

It is assumed, for a better understanding of the first embodiment, that the modulation current is only applied to the electrode 30a. In this instance, the frequency modulation response may be plotted as indicated by a chained line 60 in FIG. 6. This response curve 60 is analogous to the response curve 50 shown in FIG. 4. On the contrary, if the modulation current is only applied to the electrode 30b', the frequency modulation response may be plotted as indicated by a broken line 62, which is similar to the above-mentioned response curve 52 although the response curve is slightly changed due to the bias current applied to the electrode 30b'.

According to the first embodiment, the modulation current is applied to the electrodes 30a and 30b' while adjusting the bias current applied to the electrode 30b'. The resultant frequency modulation response is plotted as indicated by a solid line 64, which indicates that the response is flat over a practically useful range from 1 KHz to 5 MHz.

A second frequency modulation technique for a semiconductor laser according to the present invention will be discussed with reference to FIG. 7.

Figure 7:
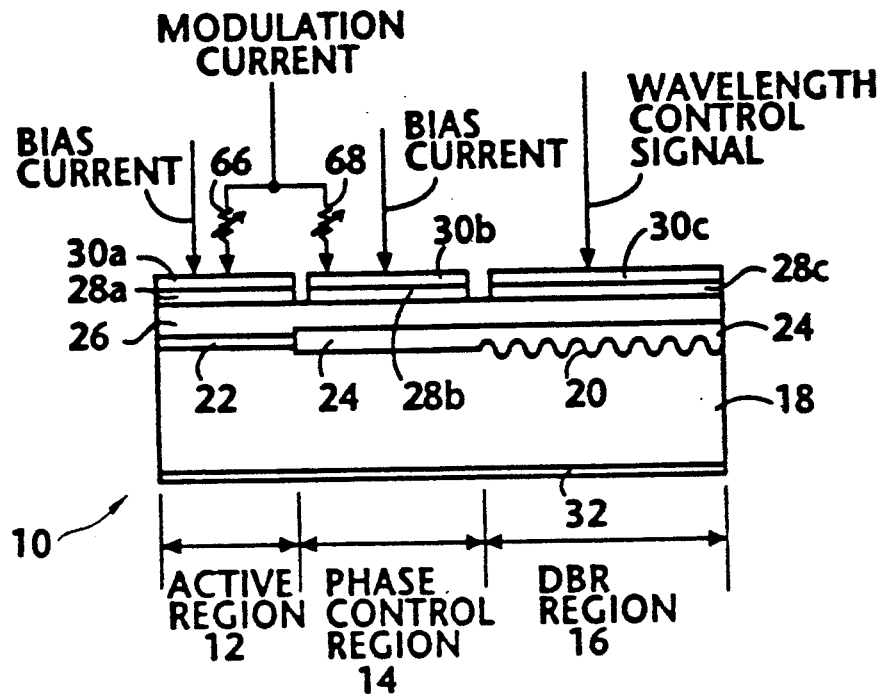
FIG. 7 illustrates second embodiment of direct frequency modulation according to the present invention.

The three-electrode semiconductor laser chip, which is shown in FIG. 7 and labeled reference numeral 10, is exactly the same as in FIGS. 1A and 1B.

As shown in FIG. 7, a modulation current is applied to the electrodes 30a and 30b by way of variable resistors 66 and 68, while a bias current is applied to the electrode 30b. Since the modulation current to be injected to the electrodes 30a, 30b can be controlled, the bias current adjustment is very flexible. The bias current injected to the electrode 30b is used to adjust the frequency modulation efficiencies at the active and phase control regions 12, 14 as in the first embodiment. The experiment conducted by the inventors reveals that when the modulation current injected to the regions 12, 14 is adjusted to a ratio of 3:1, a flat frequency modulation response over a wide range was obtained.

A third direct frequency modulation technique for a semiconductor laser according to the present invention will be discussed with reference to FIG. 8. A laser chip of the third embodiment, depicted by reference numeral 11, is of a DFB (Distributed Feedback) type and known to those skilled in the art.

Before turning to the third embodiment, the DFB type laser chip 11 will briefly be described.

Figure 8:
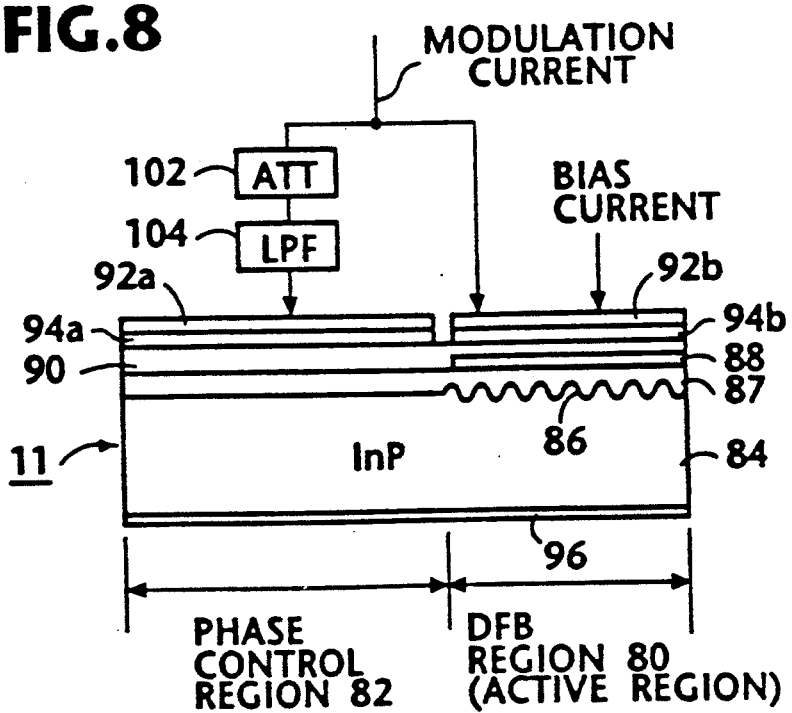
FIG. 8 illustrates third embodiment of direct frequency modulation according to the present invention.

As shown in FIG. 8, the laser chip 11 includes two regions: a DFB (viz., active) region 80 (300 μm long) and a phase control region 82 (100 μm long). An n-InP substrate 84 carries a grating 86 (2400 Å pitch) on the top surface thereof at the DFB region 80. An InGaAsP wave guide layer 87 (0.3 μm thickness, 1.3 μm wavelength) is present on the substrate 84. Further, a InGaAsP active layer 88 (0.1 μm thickness, 1.5 μm wavelength) is formed on the portion of the wave guide layer 87, which is positioned above the grating 86. A p-InP cladding layer 90 (2 μm thickness) is formed on the portion of the wave guide 87 and the active layer 88.

Although not illustrated in FIG. 8, a p-InGaAsP contact layer (0.5 μm thickness) is grown over the entire region of the cladding layer 90, after which an electrode layer is formed on the entire surface of the contact layer. The contact and electrode layers undergo preferential etching to be divided into two electrically isolated electrodes. As shown in FIG. 8, the divided contact layers of the regions 80, 82 are respectively denoted by 94b, 94a, while the divided electrodes of the regions 80, 82 are represented by 92b, 92a, respectively. Further, another electrode 96 is formed on the side of the substrate 84, which is opposite to the wave guide layer 90.

For the purpose of transverse mode control, a mesa stripe (not shown) is formed as shown in FIG. 1A, after which Fe-doped InP layers (not shown) are formed on either side thereof as shown in FIG. 1A.

When a current is injected into the active layer 88, the grating 86 functions as a reflecting mirror of the laser and thus lasing oscillation occurs. Part of the laser light produced at the active layer 88, enters the phase control region 82 and reflected at the left edge of the laser and thereafter fed back to the active layer 88.

Figure 9:
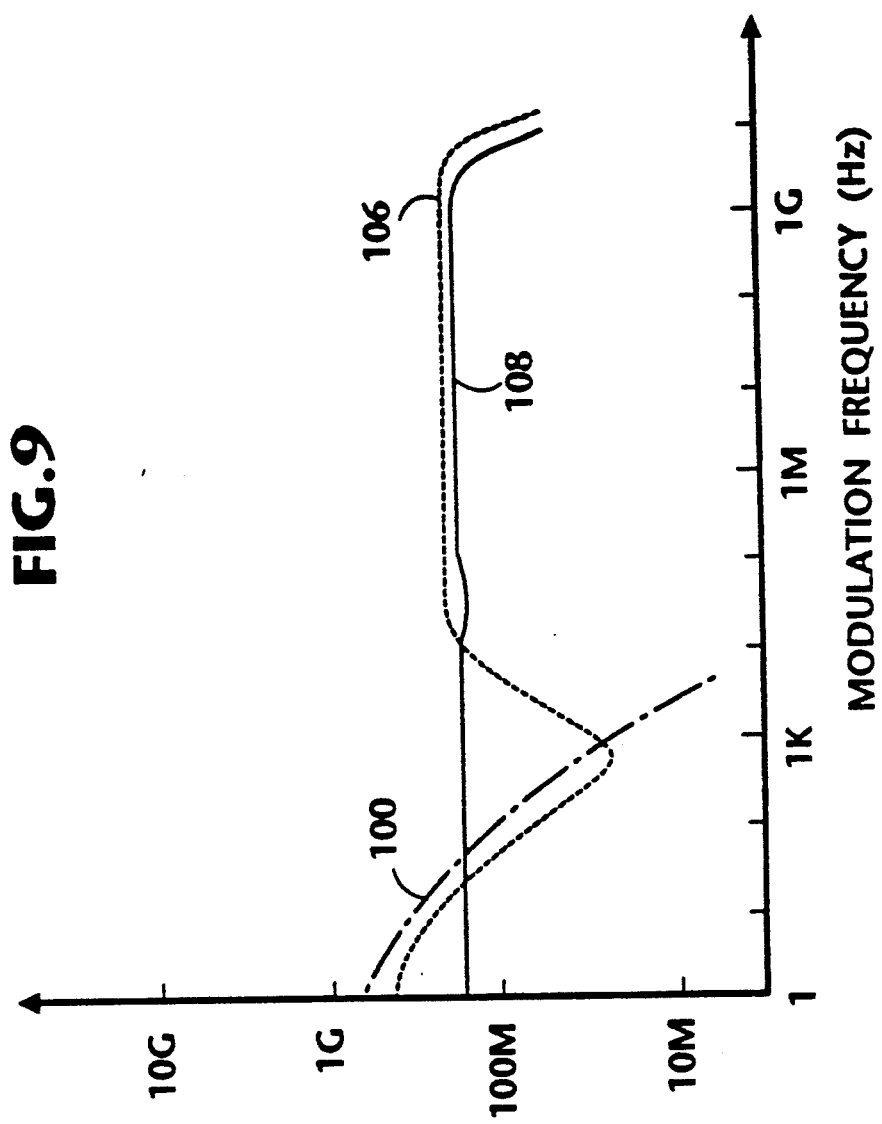
FIG. 9 is a graph showing a frequency modulation response characteristics obtained using the technique shown in FIG. 8.

The third direct frequency modulation will be discussed with reference to FIGS. 8 and 9.

In the event that a modulation current is injected only to the active layer 88, the frequency modulation response is plotted as indicated by a chained line 100. This response curve 100 drops sharply due to the thermal effect in a low frequency range.

In order to compensate for the thermal effect in the low frequency range, the modulation current is first attenuated to an appropriate value at an attenuator 102, after which the low frequency current of the output of the attenuator 102 is injected to the phase control region 82 using a low-pass filter 104. The frequency modulation response, when the low frequency current is injected to the electrode 92a (viz., the phase control region 82), is plotted as indicated by a broken line 106. The frequency modulation at the phase control region 82 is induced by blue-shift, while the thermal effect in the low frequency range at the active layer 88 is the red-shift.

As shown in FIG. 8, the modulation current is directly injected to the DFB (active) region 80, while the low frequency of the modulation signal is injected to the phase control region 82. Thus, a flat frequency modulation response can be obtained which is plotted as indicated by a solid line 108.

A fourth direct frequency modulation technique for a semiconductor laser according to the present invention will be discussed with reference to FIG. 10.

Figure 10:
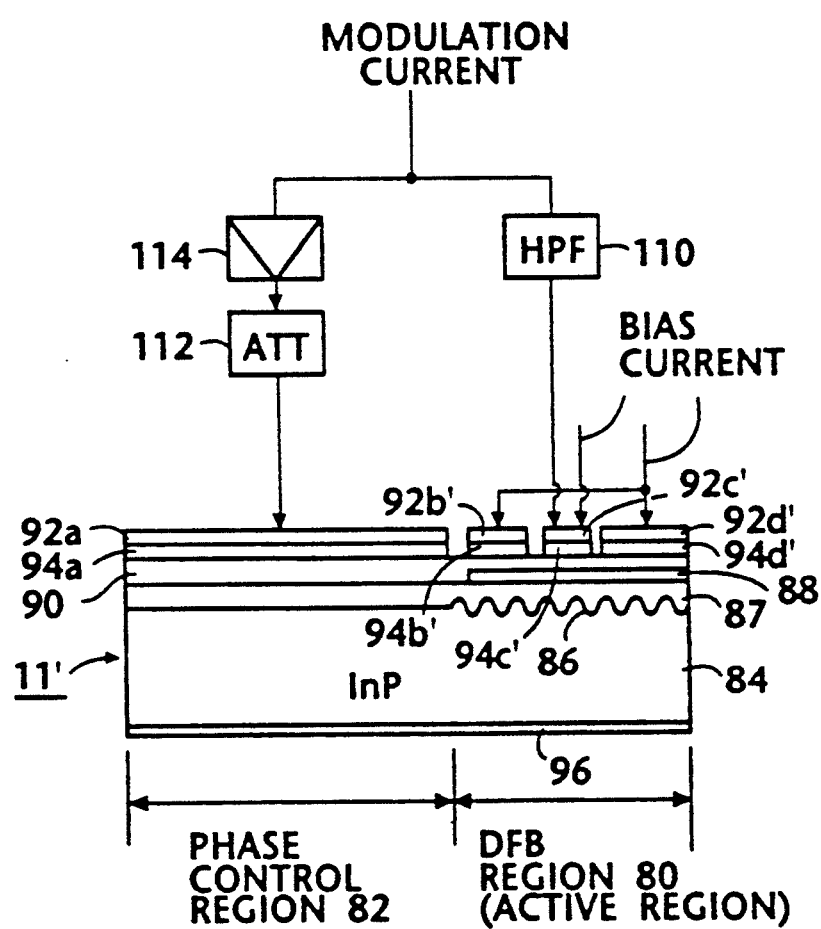
FIG. 10 illustrates fourth method of direct frequency response according to the present invention.

A four-electrode semiconductor laser chip 11' shown in FIG. 10 differs from that shown in FIG. 8 in that the electrode 92b of the latter structure is divided three electrodes 92b', 92c' and 92d'. With this division of the electrode 92b, the contact layer 94b in FIG. 10 is divided into three layers 94b', 94c' and 94d' accordingly. The remaining portions of the laser chip shown in FIG. 10 are identical with those in FIG. 8, and hence further descriptions thereof will be omitted for the sake of brevity. The laser chip shown in FIG. 10 is of a conventional type.

As shown in FIG. 10, bias currents are applied to the three electrodes 92b'-92d' of the DFB region 80. It is known in the art that the laser chip 11' should be biased in a manner that the bias current injected to the electrode 92c' is high. In this instance, the frequency modulation response at the DFB region 80 exhibits the red-shift over an entire frequency range, but, the frequency modulation efficiency in a lower frequency range undesirably increases. Accordingly, a desirable flat frequency modulation response has not been obtained.

The fourth embodiment is to overcome the above-mentioned difficulty that the frequency modulation efficiency in a low frequency range is undesirably high as compared with that in a high frequency range.

As shown in FIG. 10, a high-pass filter 110 is provided to inject high frequency modulation currents to the electrode 92c' of the DFB region 80, while an attenuator 112 is provided to decrease the modulation current to an appropriate value. Since the frequency modulation characteristics at the phase and DFB regions are inversed, a phase inverse amplifier 114 precedes the attenuator 112. In more detail, the frequency modulation up to about 100 MHz, wherein a flat response is expected at the phase control region 82, is performed at the region 82. On the other hand, the frequency modulation more than 100 MHz is implemented at the DFB region 80. In order to make equal the frequency modulation efficiency over a wide range, the modulation current injected to the electrode 92a is controlled by the attenuator 112. It should be noted that the bias current applied to the electrode 92c' should be kept high as in the conventional technique. A flat frequency modulation response, ranging from DC (direct current) to more than 100 MHz, has been obtained.

A fifth embodiment of the present invention will be discussed with reference to FIG. 11. The fifth embodiment relates to a DBR type semiconductor laser which features an improved electrode arrangement. The body of the laser shown in FIG. 11 is identical to that shown in FIGS. 1B and 1C, and hence redundant descriptions of the same portions will be omitted for brevity.

Figure 11:
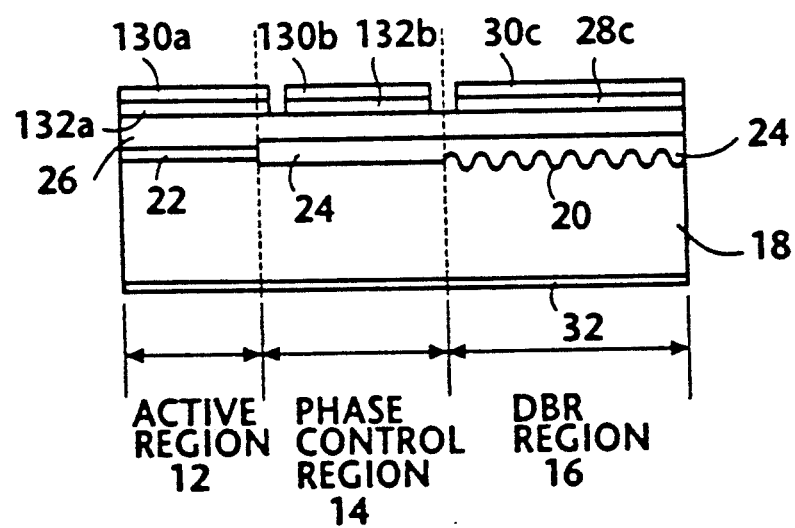
FIG. 11 is a cross sectional view of a multi-electrode laser semiconductor laser according to the present invention.

The electrode arrangement shown in FIG. 11 differs from that of FIGS. 1A and 1B in that: (a) one end of an electrode 130a of FIG. 11 extends into the phase control region 14 and (b) one end of an electrode 130b provided on the region 14 retracts accordingly. With this arrangement, corresponding contact layers 132a and 132b are configured to meet the arrangements of electrodes 130a and 130b, respectively. According to the fifth embodiment, there is no need for the modulation current to be injected to the regions 12 and 14 by way of two electrodes as in the first embodiment (FIG. 5). By way of example, when the length of the active layer 12 is 300 μm and the light output is set to 10 mW, the electrode 130a extends into the phase control region 14 by 30 μm. According to the experiment by the inventors, the frequency modulation response obtained was similar to the response shown in FIG. 6.

While the foregoing description describes five embodiments according to the present invention, the various alternatives and modifications possible without departing from the scope of the present invention, which is limited only by the appended claims, will be apparent to those skilled in the art.

What is claimed is:

1. A multi-electrode semiconductor laser which includes:
    a substrate;
    an active region formed on said substrate and having an active layer which functions as a gain medium of laser oscillation;
    a phase control region formed on said substrate and having a first lightwave guide for controlling phases of oscillation wavelength;
    a Bragg reflector region formed on said substrate and having a second lightwave guide with a grating, said first and second lightwave guides being connected in series; and
    each of said active region, said phase control region and said Bragg reflector region being provided with an electrode for receiving an injection current;
    characterized in that said electrode provided for said active layer extends into said phase control region.

2. An arrangement for inducing a flat frequency modulation response in a multi-electrode semiconductor laser, said semiconductor laser including an active region and at least one phase control region without an active layer, said semiconductor laser modulates an oscillation light by receiving a modulation current, from a modulation current generating means, at both of said active region and said at least one phase control region, said arrangement comprising:
    a series circuit which includes an attenuator and a low pass filter, said series circuit being provided between said modulation current generating means and said at least one phase control region.

3. An arrangement for inducing a flat frequency modulation response in a multi-electrode semiconductor laser, said semiconductor laser including an active region and at least one phase control region without an active layer, said semiconductor laser modulating an oscillation light by receiving a modulation current, from a modulation current generating means, at both of said active region and said at least one phase control region, said arrangement comprising:

a series circuit which includes a phase inverse amplifier and an attenuator, said series circuit being provided between said modulation current generating means and said at least one phase control region; and a high pass filter provided between said modulation current generating means and said active region.

4. A method of inducing a flat frequency modulation response in a multi-electrode semiconductor laser, said laser including an active region and at least one phase control region which does not have an active layer, said method including the steps of:

applying a first modulation current to the active region; and applying a second modulation current, which has a magnitude that is different from a magnitude of the first modulation current, to the at least one phase control region.

5. A method as claimed in claim 4, further comprising the step of:

controlling the frequency bandwidth of the first modulation current applied to the active region so as to be different from the frequency bandwidth of the second modulation current applied to the at least one phase control region.

6. A method as claimed in claim 5, further comprising the step of:

controlling the first modulation current applied to the active region so as to be different in phase from the second modulation current applied to the at least one phase control region.

7. A method of inducing a flat frequency modulation response in a multi-electrode semiconductor laser, said laser including an active region and at least one phase control region which does not have an active layer, said method including the step of:

applying a first modulation current to the active region;

applying a second modulation current to the at least one phase control region; and controlling the frequency bandwidth of the first modulation current so as to be different from the frequency bandwidth of the second modulation current.

8. A multi-electrode semiconductor laser which includes:

a substrate;

an active region formed on said substrate and having an active layer which functions as a gain medium of laser oscillation, said active region having an electrode;

phase control region formed on said substrate and having a first lightwave guide for controlling phases of oscillation wavelength, said phase control region having two electrodes arranged along a longitudinal direction of said substrate;

a Bragg reflector region formed on said substrate and having a second lightwave guide with a grating, said first and second lightwave guides being connected in series, said Bragg reflector region having an electrode, wherein each of said electrodes of said active region, said phase control region and said Bragg reflector region being supplied with an injection current;

said electrode of said active region being integral with one of said two electrodes of said phase control region.

* * * * *